United States Patent [19]

Bonaccio

[11] Patent Number: 4,697,099
[45] Date of Patent: Sep. 29, 1987

[54] OPEN LINE DETECTOR CIRCUIT

[75] Inventor: Anthony R. Bonaccio, Shelburne, Vt.

[73] Assignee: International Business Machines Corporation, Armonk, N.Y.

[21] Appl. No.: 925,018

[22] Filed: Oct. 30, 1986

[51] Int. Cl.⁴ ............................................. H03K 5/24
[52] U.S. Cl. .................................. 307/355; 307/254; 307/360
[58] Field of Search ............... 307/355, 356, 360, 254; 328/146, 147, 148

[56] References Cited

U.S. PATENT DOCUMENTS

| | | | |
|---|---|---|---|
| 3,812,431 | 5/1974 | Fry | 328/137 |
| 4,032,796 | 6/1977 | Fulkerson | 307/218 |
| 4,237,387 | 12/1980 | Devendorf et al. | 307/203 |
| 4,291,356 | 9/1981 | Mathieu | 361/87 |
| 4,300,063 | 11/1981 | Dunphy et al. | 307/355 |
| 4,306,159 | 12/1981 | Wiedmann | 307/457 |
| 4,306,270 | 12/1981 | Miller et al. | 361/187 |
| 4,494,017 | 1/1985 | Montegari | 307/463 |
| 4,590,391 | 5/1986 | Valley | 307/355 |

FOREIGN PATENT DOCUMENTS 0117910  6/1985  Japan ................................. 307/355

Primary Examiner—John Zazworsky
Attorney, Agent, or Firm—Francis J. Thornton

[57] ABSTRACT

This describes an open detector circuit essentially composed of comparator circuits with their outputs coupled to each other and to an open collector driver stage, driven from the output of the comparators. The detector circuit compares the voltages, such as may be present on twisted wire pairs, connected to its line inputs to set a predetermined line voltage output. If any of the input lines connected to the detector circuit becomes open the detector circuit is held in a specified state indicating such opening until it is actively reset. The detector circuit can detect and compare both positive and negative voltages with respect to different voltage sources.

5 Claims, 1 Drawing Figure

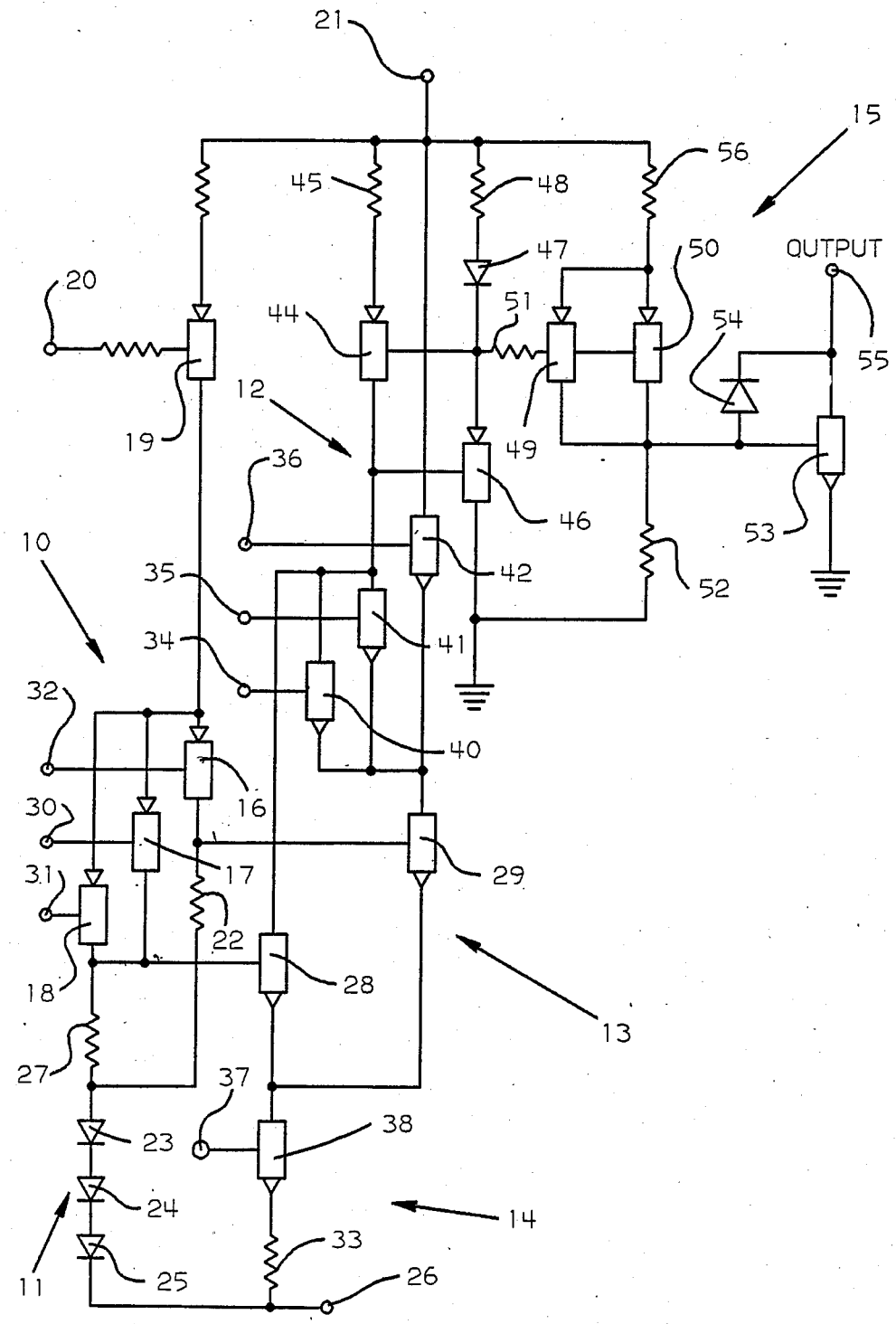

OPEN LINE DETECTOR CIRCUIT

BACKGROUND OF THE INVENTION

Transceivers are transmitter (or driver) receiver units that connect a host or other intelligent controller to a set of peripheral devices. Such transceivers are usually composed of bidirectional driver receiver pairs or channels, with each channel providing an interface between differential signal levels transmitted via input lines, such as may be found in twisted pair cables, and internal logic signal levels within the machine or computer to which the transceiver is coupled. The bidirectional driver outputs are connected across the input lines in the interface to the receiver inputs. The receiver outputs are connected to the driver inputs.

Such transceivers require that any open input lines be detected because the noise immunity of such differential systems is dependent on the presence of both signals in the differential pair. In such systems, the absence of one of the differential signals due to an open in the input lines often results in random, difficult-to-reproduce transmission errors. It is therefore, imperative that such opens be immediately detectable.

SUMMARY OF THE INVENTION

The present invention describes an open detector circuit which will assure that whenever any of the input lines (such as the lines in twisted pair cables) connected thereto becomes open between its terminating, i.e. (origin and destination) resistors that a signal providing an immediate indication of the state of the line will be generated.

The circuit of the present invention further performs two distinct functions in that it compares two separate groups of signals to two separate references. The reference levels are arbitrary and limited only by the DC operating parameters of the circuit. The present invention provides a logical signal output indicating whether or not any of the first group of signals has fallen below the first reference level or any of the second group of signals has risen above the second reference level.

These and other general and specific objects, advantages and aspects of the invention will become apparent when reference is made to the following detailed description considered in conjunction with the accompanying drawing.

BRIEF DESCRIPTION OF THE DRAWING

The figure is a schematic of the open line detector circuit of the invention.

DETAILED DESCRIPTION OF THE PREFERRED EMBODIMENT

Referring now in greater detail to the drawing, which illustrates, in schematic form, the open line detector circuit of the invention and generally comprises a first comparator circuit 10, having a current source 19, and a second comparator circuit 12 with both comparator circuits being coupled to an emitter coupled transistor switch 13 coupled to a current source 14. The second comparator circuit 12 is further coupled through a current mirror to an open collector output driver stage 15.

The first comparator 10 comprises three PNP transistors 16, 17 and 18, all having their emitters connected together and to the collector of a PNP current source or current controlling transistor 19 whose base is connected to a positive reference voltage source 20 and whose emitter is connected to a positive voltage source 21 through a resistor. The collector of reference transistor 16, of the PNP comparator 10, is coupled through a resistor 22 and the level shifter 11, comprised of three serially arranged diodes 23, 24 and 25, to a negative voltage source 26. If desired, a battery may be substituted for this level shifter. The collectors of receiving transistors 17 and 18 are coupled together and through another resistor 27 to the collector of transistor 16 via resistor 22. The collectors of transistors 17 and 18 are also coupled to the base of an NPN transistor 28 in the switch 13 and through the level shifter 11 to voltage source 26. The collector of transistor 16 is coupled to the base of the other NPN transistor 29 in the switch 13. The bases of transistors 17 and 18 are coupled to respective input signal sources 30 and 31 while the base of transistor 16 is coupled to a reference voltage source 32.

The second comparator 12 comprises three NPN transistors 40, 41 and 42 whose emitters are all coupled together and to the collector of transistor 29 in the switch 13. The collector of reference transistor 42 is coupled to the positive power supply 21. The collectors of receiving transistors 40 and 41 are coupled together and to a standard buffered PNP current mirror comprised of PNP source transistor 44, PNP device transistor 46, and PNP mirror transistors 49 and 50 together with resistors 45, 48 and 56 and diode 47. The collectors of transistors 40 and 41 are also coupled to the collector of the other NPN transistor 28 in the switch 13. The bases of the transistors 40 and 41 are coupled to respective differential input signal sources 34 and 35 while the base of transistor 42 is coupled to a reference voltage source 36.

The emitters of the NPN transistors 28 and 29, in the switch 13, are further connected together and through current source 14 which comprises an NPN transistor 38 and a resistor 33 to the negative voltage source 26.

The output driver circuit 15 is comprised of a resistor 52 and an NPN output transistor 53 and a diode 54. The PNP mirror transistors 49 and 50 have their emitters coupled through a resistor 56 to the positive power voltage source 21 and their collectors connected to the base of the NPN output transistor 53 and through diode 54 to output 55. The output transistor 53 has its collector connected to the output 55 and its emitter coupled to ground.

Thus, the open line detector circuit shown in the FIGURE is essentially composed of NPN and PNP transistor comparator circuits coupled to a switching circuit and through a current mirror to an open collector output driver stage.

The described circuit of the invention will compare the voltages present on any of the four different inputs 30, 31, 34 or 35. The voltages present on the different inputs 30 and 31 are compared to the voltage of the reference source 32 which is at a predetermined fault voltage level while the voltages on the inputs 34 and 35 are compared to the voltage of the reference source 36 which also is a predetermined fault voltage level. The voltage levels of sources 32 and 36 should be set for a specific set of logical input conditions to the transceiver that will allow maximum separation between the normal line voltage on any input line and the minimum line voltage on the same input line when the conduction to be detected is present, for example in the discussed transceivers when a twisted wire pair or line is faulted, i.e. open.

The voltages applied at the different inputs 30, 31, 34 and 35 can be the same polarity or can be of different polarities. The inputs are usually connected to respective lines that have each end terminated in a specific resistance. These lines are normally driven by forcing equal and opposing currents of a known value into the terminating resistors. When one of the lines coupled to inputs 30, 31, 34 or 35 become open, the net value of the resistance terminating the line as seen from the origin (drive point) of the line doubles, as does the voltage caused by the constant current drive. When this occurs, one of the comparators, either 10 or 12, senses the change and compares it to one of the reference levels applied to inputs 32 or 36 respectively. If the levels present at inputs 32 and 36 are chosen correctly, the circuit will generate a signal which accurately represents the faulted, i.e. open condition.

The PNP comparator 10 formed by PNP transistors 16, 17 and 18 senses any levels on the different lines, 30 and 31, which are more negative than the reference voltage source 32 coupled to the base of the transistor 16. This PNP comparator 10 is biased by the PNP current source transistor 19 which derives its current reference from a reference source 20. A current equal to the value of the collector current through transistor 19 always flows through the diode string comprised of diodes 23, 24 and 25. This current can be switched, either through transistor 16 and resistor 22 or through either transistor 17 or transistor 18 and through collector resistor 27 depending on whether or not the level on either line 30 or 31 is more negative than the reference source 32. Similarly, comparator 12 compares different input lines 34 and 35 to the positive voltage source 36.

The NPN comparator 12 formed by NPN transistor 40, 41 and 42 senses any levels on the different lines 34 and 35 which are more positive than the reference voltage source 36 coupled to the base of transistor 42. This NPN comparator 12 is controlled by the NPN current source transistor 38 through one of the switch transistors, namely switch transistor 29. Current source transistor 38 derives it current reference from a reference source 37. A current equal to the value of the collector current through transistor 38 always flows through one of the switch transistors 28 or 29 depending on the state of the PNP comparator 10 for the PNP comparator sets the state of this switch 13. If either of the differential inputs 30 and 31 to the comparator 10 are more negative than the reference voltage source 32 supplied at the base of transistor 16 the transistor 16 shuts off and current flows through the more negatively biased transistor 17 or 18 and the current voltage resistor 27. Thus, when transistor 16 shuts off and either transistor 17 or 18 turns on, the current switch 13 switches its state because the voltage at the base of the transistor 28 rises and the voltage at the base of transistor 29 falls. This means that transistor 29 turns off and the current passing through it passes through the other transistor 28 in the current switch 13. This causes the transistor 49 to turn on which in turns causes transistors 44 and 50 to turn on and cause transistor 53 to turn on and ground the output line.

In summary, if a fault condition occurs in either line 30 or 31, i.e. if either of the differential lines, 30 or 31 falls below the voltage source 32 coupled to the base of transistor 16, the current from the current source 19 is caused to flow through resistor 27 via one of the transistors 17 and 18. When this current flows through resistor 27, a voltage drop appears across resistor 27. However, the anode of the diode 23 remains at a maximum specified voltage above the negative voltage supply 26. Since no current is now flowing in resistor 22 there is no voltage dropped across it and the collector of transistor 16 and the base of transistor 29 levels off at the same potential appearing at the anode of diode 23. The voltage drop across resistor 27 therefore appears at the base of transistor 28 with respect to the base of transistor 29. This in turn causes the current from the current source transistor 38 to switch from flowing through transistor 42 to the collectors of transistors 40 and 41 through transistor 28. This now draws current through transistor 44 altering the base voltage of transistor 49 and thus indicating a fault condition in one of the lines 30 or 31.

It should be noted that the current at the collector of the current mirror transistor 44 is not determined solely by the state of the NPN comparator 12. The emitter coupled transistor switch 13 composed of transistors 28 and 29 can also steer the current into the collector of transistor 44, based on the output of the PNP comparator 10. It is this point at which both the NPN comparator 12 and the PNP comparator 10 are coupled together.

Conversely, if either different lines 34 or 35 is more positive than the reference voltage source 36, the transistor 40 or 41 with the more positive signal on its base is turned on and transistor 42 is turned off thus the current flowing through transistor 42 is caused to switch and now flow also through the selected transistor 40 or 41, and the transistor 44 again altering the voltage at the base of transistor 49. This current flow at the collector of the selected transistor 40 or 41 and hence at the collector of PNP transistor 44 and at the base of transistor 49 is a clear indication of a fault condition in one of the input different lines 34 or 35.

In summary, if, for example, the PNP comparator 10 produces a fault indication, the collectors of transistors 17 and 18 become positive with respect to the collector of transistor 16. The current from current source 14 will be switched through transistor 28 in the current switch 13. This current, by passing through current switch transistor 28, is diverted from flowing through the NPN comparator transistor 42 and instead is switched to flow through transistor 44. This is the same as if the NPN comparator had detected a fault on one of the different lines 34 or 35. If the PNP comparator 10 detects no fault on the different lines 30 or 31, the NPN comparator 12 is energized via transistor 29 and performs its check of the differential lines 34 and 35. Ultimately, the result of a fault in either of the comparators 10 or 12 produces a current flow in the collector of the source transistor 44. This current is mirrored via transistors 46, 49 and 50 into the output transistor 53 for the resulting voltage drop occurring across the output resistor 52 causes the output transistor 53 to conduct heavily which pulls down the output line 55 and indicates that there is an open fault in one of the differential input lines of either comparator 10 or 12.

Once the output line 55 is pulled down it remains in its pulled down condition until such time as the fault is corrected and pull-up is provided to line 55 via a pull-up circuit (not shown).

It should be noted that although voltage sources 21 and 26 were referenced to as positive and negative for purposes of the above example that these were arbitrary and can be different and limited only by the DC operating parameters selected for the circuit.

The present invention provides a logical signal output indicating whether or not any of the first group of signals has fallen below the first reference level or any of the second group of signals has risen above the second reference level.

The circuit of the invention is useful under a wide range of conditions, and it should be noted that its speed is restricted only by the technology used to produce the transistors. For example, using technology to produce vertical PNP transistors it will operate at logic speeds. Moreover FETs can be substituted for the various transistors without creating any performance limitations.

Although a preferred embodiment and selected modifications of the invention have been disclosed and described, it is apparent that other embodiments and modifications of the invention are possible. For example, more differential lines, i.e. signal inputs per comparators and more comparator circuits may be coupled to the same point. Therefore the invention is to be limited only by the scope of the appended claims.

What is claimed is:

1. A multisignal comparator circuit comprising:
   a pair of comparator stages, each of said stages comprising a plurality of like transistors,
   the transistors of the first stage being of a type different from the transistors of the second stage,
   each stage comprising a reference transistor having a reference voltage applied thereto and at least one receiving transistor having an input signal applied thereto,
   the first stage being coupled to the second stage to control the current passing through the receiving transistor in the second stage,
   said first stage is provided with complementary outputs and said complementary outputs are coupled to an emitter coupled switch whose outputs are coupled to said second stage.

2. The circuit of claim 1 wherein each of said stages is coupled to a respective current source.

3. The circuit of claim 2 wherein each of said complementary outputs is coupled to a respective switching transistor in said emitter coupled switch,
   each transistor in said switch being positioned between selected points in said second stage and said current source for said second stage.

4. A multisignal comparator circuit comprising:
   a first comparator stage having a reference voltage applied thereto and having an input signal applied thereto,
   said first comparator stage being coupled between a first voltage source and a second voltage source,
   said first comparator stage further having two outputs,
   a second comparator stage having a reference voltage applied thereto and an input signal applied thereto, being coupled to said first voltage source and to said second voltage source,
   an emitter coupled switch coupled to the first and second comparator stages, and
   a current mirror circuit coupled to the second comparator stage and to an output line such that the state of the output line is altered when the input signal to a selected one of said comparator stages differs by a predetermined amount from the reference voltage applied to said selected one of said comparator stages.

5. A multisignal comparator circuit comprising:
   a first comparator stage comprising a reference transistor having a first reference voltage applied thereto and a receiving transistor having an input signal applied thereto,
   said first comparator stage being coupled to a first voltage source through a current controlling transistor and to a second voltage source through a voltage shifter,
   said first comparator stage further having two outputs, the first one of said outputs coupled between the reference transistor and a first resistor and through said first resistor to the voltage shifter and the second one of said outputs coupled between the receiving transistor and a second resistor and through said second resistor to the voltage shifter,
   a second comparator stage comprising a different reference transistor having a second reference voltage applied thereto and a receiver transistor having an input signal applied thereto,
   the reference transistor of said second stage being coupled to said first voltage source and through a first switching transistor and a current source to said second voltage source,
   the receiving transistor of said second stage being coupled to said first voltage source through a source transistor of the opposite type and to said second voltage source through said first switching transistor and said current source,
   said first switching transistor being further coupled to the first output of said first stage,
   a second switching transistor being further coupled to the second output of said first stage and to said second comparator stage between said receiving transistor and said source transistor,
   a current mirror circuit including the source transistor coupled to a drive transistor and a mirror transistor, and
   an output line coupled to said mirror circuit and to an output transistor such that the state of the output line is altered when the respective input signal to one of said comparator stage differs by a predetermined amount with respect to the respective reference voltage applied to the respective comparator stage.

* * * * *